United States Patent [19]

Darrasse et al.

[11] Patent Number: 4,968,936
[45] Date of Patent: Nov. 6, 1990

[54] ANTENNA FOR A NUCLEAR MAGNETIC RESONANCE IMAGING DEVICE

[75] Inventors: Luc Darrasse, Paris; Olivier Ernst, Croix, both of France

[73] Assignee: Magnetech, Vandoeuvre-les-Nancy, France

[21] Appl. No.: 330,387

[22] Filed: Mar. 29, 1989

[30] Foreign Application Priority Data

Mar. 30, 1988 [FR] France .............................. 88 04163

[51] Int. Cl.$^5$ .......................................... G01R 33/20
[52] U.S. Cl. .............................. 324/318; 128/653 SC
[58] Field of Search ............... 324/300, 307, 318, 322; 128/653

[56] References Cited
U.S. PATENT DOCUMENTS 4,733,190 3/1988 Dembinski .......................... 324/318
4,831,330 5/1989 Takahashi ........................... 324/318

FOREIGN PATENT DOCUMENTS 3628035 2/1988 Fed. Rep. of Germany ...... 324/318

Primary Examiner—Hezron E. Williams
Assistant Examiner—Kevin D. O'Shea
Attorney, Agent, or Firm—Sughrue, Mion, Zinn, Macpeak & Seas

[57] ABSTRACT

The present invention relates to antennas for nuclear magnetic resonance imaging devices. The antenna (10) of the invention essentially is formed of two support plates (11, 12) made of electrically insulating material. Spacers (13) hold the two plates at a fixed distance apart in two parallel planes, and releasably fixing at least one of the two plates (11) to the spacer means (13). At least first and second turns (17, 18) of electrically conductive material are fixed on respective first faces (15, 16) of the two plates in order to form two current loops substantially centered on a common axis (100) perpendicular to the faces with capacitive coupling together of the ends of each current loop. The invention is applicable to scanners, in particular for scanning the human brain.

10 Claims, 2 Drawing Sheets

ANTENNA FOR A NUCLEAR MAGNETIC RESONANCE IMAGING DEVICE

The present invention relates to nuclear magnetic resonance imaging devices such as those used in medical establishments for making images of various internal portions of the human body, in particular the head, and more particularly for examining the brain and the bulbar-medular join for the purpose of detecting possible tumors, for example.

BACKGROUND OF THE INVENTION

Such devices are already well known and in relatively wide use in spite of their high cost. Very briefly, such a device comprises a frame supporting a magnet including means for generating a magnetic field in which the lines of force are all oriented in the same direction. These field generator means are generally constituted by a plurality of turns wound side by side to constitute a magnetic oil defining an empty space in the center thereof through which the lines of force of a uniform "main" magnetic field extend.

The device further includes, in association with the magnet, a support for supporting the body of a patient, e.g. a bed mounted on means enabling the bed to be moved through the center of the coil in a direction parallel to the lines of force of the magnetic field provided by the coil.

This generator of a static longitudinal magnetic field is associated with means for setting up other magnetic fields having gradients and capable of being oriented, for example, along three different directions in the space occupied by the volume of the portion of the body under examination for the purpose of forming an image thereof, e.g. the brain in the above-mentioned example, together with radio frequency excitation means, and means for detecting nuclear magnetic resonance signals produced by some of the atoms in the portion of the body being scanned.

It should also be specified that in some devices the excitation means and the detection means may be constituted by a common sensor portion, with merely the input means to said sensor changing with the desired function, i.e. excitation or detection. The person skilled in the art commonly refers to this type of sensor by the term "antenna".

There are various different possible structures for such antennas, generally making it possible to define a cylindrical zone suitable for being placed in the center of the magnetic coil with the axis of the cylindrical zone extending in the same direction as the above-defined main magnetic field. However, in order to be fully effective, this cylindrical zone should surround the portion of the body to be scanned, and should surround it as closely as possible.

In order to achieve the result, attempts have been made to provide special sensor structures, however none of them have given advantageous results so far, i.e. facilitating installation of the sensor in the imaging device around the portion of the patient's body to be scanned and surrounding said portion as closely as possible.

The object of the present invention is to provide a nuclear magnetic resonance imaging device, and more particularly an "antenna" element therefor of a structure enabling it to be adapted very easily to image making requirements with respect to the portion of the body to be scanned, and also fitting closely around said portion of the body and surrounding it as closely as possible, for the purpose of setting up secondary magnetic fields in different orientations relative to the main magnetic field generated by the magnet.

SUMMARY OF THE INVENTION

More precisely, the present invention provides an antenna for a nuclear magnetic resonance imaging device, comprising:

two support plates of electrically insulating material;

spacer means for holding said two plates at a determined distance apart from each other in two substantially parallel planes;

releasable fixing means for fixing at least one of said two plates to said spacer means;

at least first and second turns of electrically conductive material;

means for fixing said turns on respective first faces of said two plates in order to form two current loops substantially centered on a common axis extending perpendicularly to said faces of said plates; and capacitive coupling means for coupling together the ends of each current loop.

BRIEF DESCRIPTION OF THE DRAWINGS

An embodiment of the invention is described by way of example with reference to the accompanying drawings, in which.

DETAILED DESCRIPTION

FIGS. 1 to 5 show a single embodiment of an antenna for a nuclear magnetic resonance imaging device, and the same references are used throughout for designating the same items.

Figure 1:
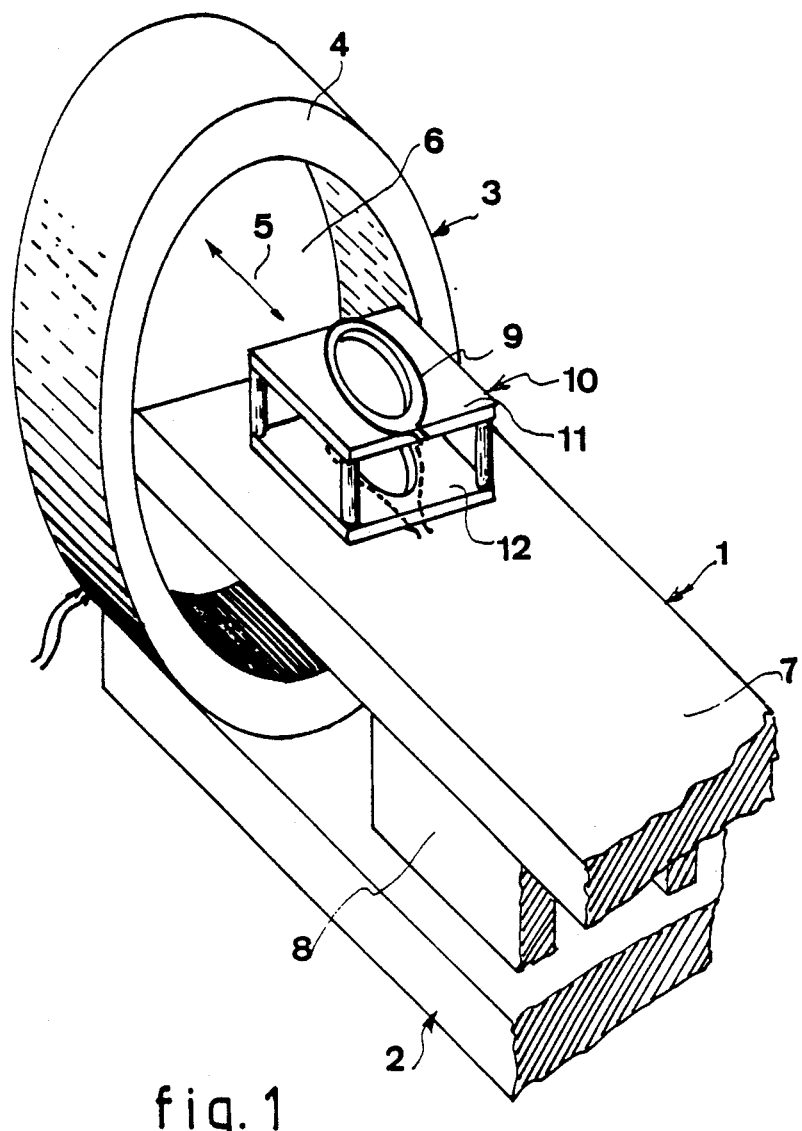
FIG. 1 is a perspective view diagrammatically outlining the main parts of a nuclear magnetic resonance imaging device, and showing one embodiment of an "antenna" element in accordance with the invention.

FIG. 1 is a diagram showing a device for making images off portions of the human body, and commonly called a "scanner" by the person skilled in the art.

Such a device 1 comprises a frame 2 supporting a magnetic 3, with the term "magnet" being used in its widest sense, i.e. covering both permanent magnets and electromagnets. In the embodiment shown, the magnet 3 comprises a magnetic field generator 4 for generating a field whose lines of force are all oriented along the same direction 5. The generator 4 is generally constituted by a plurality of turns wound side by side in order to form a magnetic coil defining an empty space 6 in the center thereof through which the lines of force of a uniform so-called "main" magnetic field are established.

The device 1 also includes, in association with the magnet 3, a support 7 for the body of a patient, e.g. a bed mounted on means 8 enabling the bed to be moved along a direction parallel to the direction 5 of the lines of force of the magnetic field provided by the coil 4, and within the magnetic field in the center of the space 6 defined by said coil.

This generator for generating a main longitudinal field is associated with means 9 for setting up secondary magnetic fields having gradients and capable of being oriented, for example, along three directions in the space occupied by the volume of the portion of the body under examination, and which is to have an image formed thereof (e.g. the brain), radio frequency excitation means, and means for detecting the nuclear magnetic resonance signals produced by some of the atoms in the portion of the body being scanned.

These excitation and detection means may be constituted by a single sensor portion, with only the inlet means to the sensor changing depending on the desired function, i.e. excitation or detection. The person skilled in the art commonly refers to such a sensor 10 by the term "antenna".

The antenna 10 defines a cylindrical zone suitable for being placed in the center of the main magnetic coil 4 and, in the embodiment shown, it comprises two support plates 11 and 12 made of an electrically insulating material, e.g. plastic.

These two plates 11 and 12 are held apart at a determined distance from each other by spacer means 13, and they are advantageously held in two substantially parallel planes.

These spacer means are connected to at least one of the two plates by releasable fastening means 14.

Each of the two plates has at least one face 15 or 16 having a respective first or second turn 17 or 18 of electrically conductive material situated thereon, and most advantageously, each of the other two faces 21 and 22 of the two plates 11 and 12 respectively opposite to the two faces 15 and 16 also has a corresponding third and fourth turn 19 or 20 respectively fixed thereon.

Such a structure makes it possible to establish two turnable current loops via which it is possible to obtain a secondary magnetic field whose lines of force extend perpendicularly to the direction 5 of the lines of force of the main magnetic field.

Figure 4:
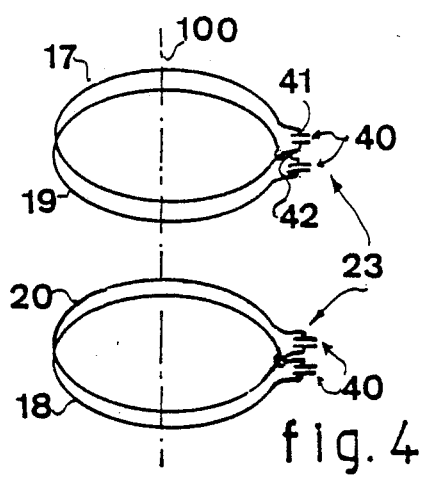
FIGS. 4 and 5 are two electrical circuit diagrams for showing an advantage of the antenna structure in accordance with the invention.
Figure 5:
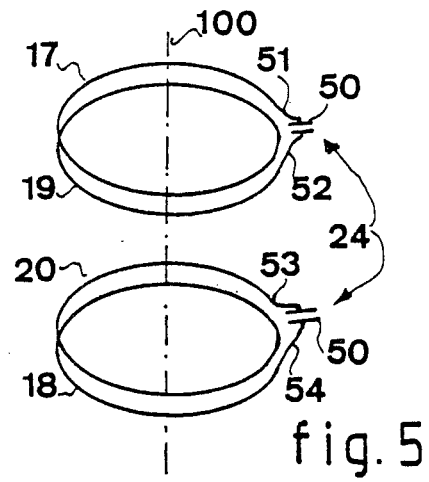

The antenna 10 also comprises either first capacitive coupling means 23 for coupling together the two ends of each of the turns 17-20 as shown in FIG. 4, or else second capacitive coupling means 24 as shown in FIG. 5 for coupling one end of the first turn 17 with one end of the third turn 19, and one end of the second turn 18 with one end of the fourth turn 20, while the other ends are interconnected in pairs to form two coils each containing two turns.

Naturally, the antenna includes means 29 such as straps surrounding the turn-forming conductors with the ends of the means 29 being fixed to the plates for the purpose of holding the turns on respective faces of the two plates so that the current loops are substantially centered on a common axis 100 which is substantially perpendicular to the faces of the plates.

An antenna as described above is particularly suitable for forming an image of the human brain. Thus, in order to enable the turns to surround this portion of the human body as closely as possible, at least one of the two plates, e.g. the plate 11 for surrounding the top portion of the patient's face includes a cut-out 25, and the, or each, turn 17, 19 associated with the plate 11 is then situated substantially at the edge 26 of said cut-out (see FIG. 3). In this application of a magnetic responance imaging device, the length of the spacer means 13 is less than the thickness of the patient's head of which an image is to be formed, such that the edge 26 of the cut-out 25 surrounds the face of the patient when the back of the patient's head is resting against the other plate 12. In order to enable the turns to take up an even better and closer position, the second plate 12 may also have a cut-out like the cut-out 25 made in the plate 11, with the turns 18 and 20 associated therewith being situated around the edge of said cut-out.

Figure 2:
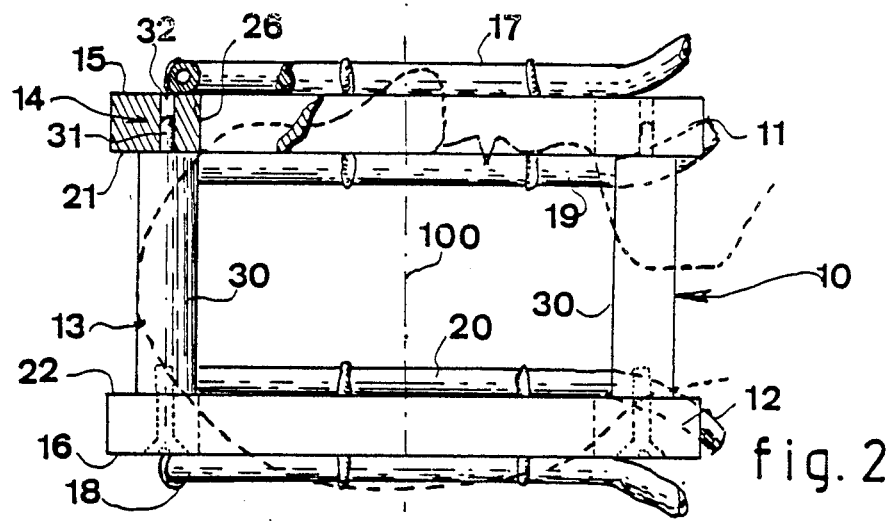
FIGS. 2 and 3 are two perpendicular sections through the FIG. 1 embodiment of an antenna for a nuclear magnetic resonance imaging device in accordance with the invention.
Figure 3:
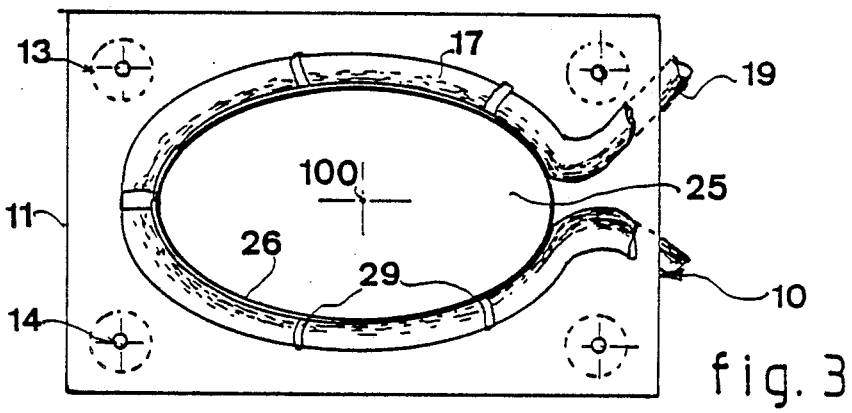

In order to illustrate this advantage, FIG. 2 shows the outline of a patient's head in dashed lines with the head being shown surrounded by the antenna of the invention, thereby clearly demonstrating the fact that the upper and lower turns surround as closely as possible the brain of the patient to be examined.

Such positioning of the antenna relative to the portion of the body to be examined is easily obtained using the releasable fixing means 14. The spacer means 13 may be constituted, for example, by a plurality of spacers 30, e.g. four spacers, and the fixing means 14 may comprise respective male pegs 31 each disposed at one end of a spacer 30, and complementary female orifices 32 suitable for receiving the pegs 31 and formed in the other half of the assembly, i.e. in the plate 11.

The above-described structure makes it possible to make use of different upper and lower current loops and to dispose the two plates on which they are situated at different distances apart so as to establish a secondary magnetic field perpendicular to the main field and thereby improve the performance of the structure as an antenna.

FIG. 4 shows a first embodiment of the capacitive coupling means. In this first embodiment, the coupling means 23 are constituted by respective capacitors 40 each having two terminals 41 and 42 connected to opposite ends of a corresponding turn. In this embodiment of the capacitive coupling means, there must therefore be one capacitor per turn, however it makes it possible to obtain various different combinations, for example two loops: one upper loop and one lower loop; or four loops, namely two upper loops and two lower loops connected in parallel.

FIG. 5 shows a second possible embodiment of the coupling means 24 which are constituted in this case by two capacitors 50 whose terminals 51, 52 or 53, 54 are connected respectively to one end of each of the first and third turns 17 and 19 and to one end of each of the second and fourth turns 18 and 20, with the other ends of these turns being electrically interconnected in pairs in order to form two loops each comprising two turns. These coupling means 24 give rise to a higher value of induction than the means shown in FIG. 4.

When the antenna 10 of the nuclear magnetic resonance imaging device is applied to the brain, the two ends of a turn are curved outwardly from the turn so as to leave a space therebetween to pass the patient's neck. If the antenna comprises two pairs of turns, the ends of these turns are then disposed so as to generate a uniform secondary magnetic field. To do this, the two ends of one of the turns situated on one side of a plate are substantially parallel to the two corresponding ends of the turn situated on the other side of the same plate, as shown in FIG. 2.

In should be understood that the term "plate" used in the above description must be extended to include any support suitable for holding the first and third turns or the second and fourth turns substantially in two planes at a determined distance apart.

What is claimed is:

1. An antenna for a nuclear magnetic resonance imaging device, comprising:
   two support plates of electrically insulating material having opposite first and second faces;
   spacer means for holding said two plates at a determined distance apart from each other in two substantially parallel planes;
   releasable fixing means for fixing at least one of said two plates to said spacer means;
   at least first and second turns of electrically conductive material;
   means for fixing said turns on respective first faces of said two plates in order to form two current loops substantially centered on a common axis extending perpendicularly to said faces of said plates; and
   capacitive coupling means for coupling together the ends of each current loop.

2. An antenna according to claim 1, wherein at least one of said two plates includes a cut-out, with said turn associated with said plate being situated substantially around the edge of said cut-out.

3. An antenna according to claim 1, further comprising at least third and fourth turns fixed respectively to the second faces of said plates.

4. An antenna according to claim 1, wherein said capacitive coupling means comprises a capacitor having two terminals connected to respective ends of the same turn.

5. An antenna according to claim 3, wherein the capacitive coupling means comprises a first capacitor interconnecting one end of each of the first and third turns and a second capacitor connected to one end of each of said second and fourth turns, and wherein the other ends of said turns are electrically interconnected in pairs.

6. An antenna according to claim 2 for imaging a head of a patient, wherein the length of the spacer means is less than the thickness of said head of said patient.

7. An antenna according to claim 1, wherein the releasable fixing means are constituted by respective male pegs fixed to one of the two items to be fixed together, namely one of the plates and the spacer means, and by a complementary female orifice formed in the other item and suitable for receiving said peg.

8. An antenna according to claim 1, wherein the ends of the first and second turns are curved outwardly from said turns.

9. An antenna according to claim 3, wherein the ends of the first and second turns are curved outwardly from said turns, and wherein the ends of the first and third turns are parallel, as are the ends of the second and fourth turns.

10. An antenna according to claim 1, wherein said plates are made of a plastic material.

* * * * *